United States Patent
Itou et al.

(10) Patent No.: US 6,285,617 B1
(45) Date of Patent: Sep. 4, 2001

(54) SEMICONDUCTOR MEMORY DEVICE PREVENTING MALFUNCTION DURING REFRESH OPERATION EVEN WHEN NOISE IS SUPERIMPOSED ON CONTROL SIGNAL

(75) Inventors: Takashi Itou; Goro Hayakawa, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/556,775

(22) Filed: Apr. 25, 2000

(30) Foreign Application Priority Data

Oct. 29, 1999 (JP) ................................. 11-308767

(51) Int. Cl.[7] ...................................................... G11C 7/00
(52) U.S. Cl. ............................................................ 365/222
(58) Field of Search ........................... 365/222, 230.03, 365/230.06

(56) References Cited

U.S. PATENT DOCUMENTS

| | | | |
|---|---|---|---|
| 5,798,976 | * | 8/1998 | Arimoto .............................. 365/222 |
| 5,822,264 | * | 10/1998 | Tomishima et al. ................ 365/222 |
| 5,894,446 | * | 4/1999 | Itou ..................................... 365/222 |
| 5,943,280 | * | 8/1999 | Tsukamoto et al. ................ 365/222 |
| 5,999,472 | * | 12/1999 | Sakurai ............................... 365/222 |
| 6,094,389 | * | 7/2000 | Ahn ..................................... 365/201 |

FOREIGN PATENT DOCUMENTS 11-191290   7/1999   (JP) .

* cited by examiner

Primary Examiner—Richard Elms
Assistant Examiner—Anh Phung
(74) Attorney, Agent, or Firm—McDermott, Will & Emery

(57) ABSTRACT

A refresh operation is started in response to activation of a refresh control signal. The refresh control circuit controls activation of a refresh control signal in accordance with a signal level of a row address decode enable signal in addition to signal levels of control signals activated in response to activation of signals /CAS and /RAS necessary for detecting the start of a CBR refresh operation. The row address decode enable signal is an internal control signal activated upon activation of a signal /RAS and maintained in an active state until signal /RAS is inactivated. As a result, the refresh control signal is not erroneously activated during normal operation even when a noise is caused to signal /RAS.

6 Claims, 13 Drawing Sheets

| RASF | RADE | CAS | ZRF |
|---|---|---|---|
| L | L | L | H |
| | | H | L(ACTIVATED) |
| L / H / H | H / L / H | L | H(INACTIVATED) |
| | | H | MAINTAINED |

| RASF | ZRF | ZCBR |
|---|---|---|
| L | L | H |
| L | H | H(INACTIVATED) |
| H | L | L(ACTIVATED) |
| H | H | MAINTAINED |

| RASF | CAS | ZRF |
|---|---|---|
| L | L | H |
| L | H | L(ACTIVATED) |
| H | L | H(INACTIVATED) |
| H | H | MAINTAINED |

| RASF | ZRF | ZCBR |
|---|---|---|
| L | L | H |
| L | H | H(INACTIVATED) |
| H | L | L(ACTIVATED) |
| H | H | MAINTAINED |

SEMICONDUCTOR MEMORY DEVICE PREVENTING MALFUNCTION DURING REFRESH OPERATION EVEN WHEN NOISE IS SUPERIMPOSED ON CONTROL SIGNAL

BACKGROUND OF THE INVENTION

1. Field of the Invention

The present invention relates to semiconductor memory devices and, more specifically to a semiconductor memory device performing a CBR (CAS before RAS) refresh operation.

2. Description of the Background Art

Stored information is retained in a DRAM (Dynamic Random Access Memory) by accumulating electric charges in a capacitor provided in a memory cell. Accordingly, a refresh operation must periodically be performed to prevent disruption of the stored information by a leakage current. In the refresh operation, word lines provided correspondingly to rows of the memory cells are sequentially selected, and accumulated electric charges are read for all memory cells on the selected word lines and rewritten after amplification. Thus, a voltage at a storage node in the memory cell is reset at an initial value even if it has been reduced by the leakage current. By continuing to sequentially select all of the word lines, the stored information in all memory cells are reproduced, so that the stored information for the entire chip can be retained.

Here, assume that a maximum value of a refresh interval assuring prevention of data disruption for every memory cell is trefmx and the number of word lines is N. Then, a relationship of tcrf≦trefmx/N must be held to enable a refresh operation with a given refresh cycle tcrf corresponding to an interval between word lines in order to prevent disruption of stored information by a leakage current. Accordingly, if the number of word lines increases due to an increase in a storage capacity of memories, the refresh cycle must correspondingly be reduced. Thus, in a DRAM with a large storage capacity, a refresh cycle is ensured by increasing the number of word lines simultaneously selected during a refresh operation as compared with that during a normal reading/writing operation in order to increase the number of rows subjected to a single refresh operation.

There are two types of refresh operations: a refresh operation performed during a random access operation such as a reading/writing operation; and a refresh operation performed only for retaining stored information in a chip as performed during a battery backup period. Especially in the former refresh operation, a CBR (CAS before RAS) refresh has been widely used in terms of saving the number of terminals. In the CBR refresh, the start of the refresh operation is instructed by reversing the order of activating a row address strobe signal /RAS and a column address strobe signal /CAS, which are inherently control signals, with respect to the order during a normal reading/writing operation without providing a control signal dedicated to the refresh operation.

FIG. 14 is a schematic diagram showing a memory array 500 of a DRAM structured to select a greater number of word lines during the refresh operation than during a normal operation.

While not shown in the drawing, memory array 500 has a plurality of memory cells arranged in a matrix. Here, memory array 500 is of a 64-Mbit size addressed by address bits A0 to A12 of an address signal of 13 bits. Memory array 500 is divided into two regions 500a and 500b of the same size in a row direction. In each of regions 500a and 500b, word lines are provided correspondingly to rows of the memory cells.

For row selection, the last bit A12 of the address signal is used for selecting one of regions 500a and 500b of the memory array. In each of regions 500a and 500b, one memory cell row is selected and a corresponding word line is activated in accordance with a combination of the remaining address bits A0 to A11 of 12 bits. Thus, the word lines corresponding to the same combination of signal levels of address bits A0 to A11 are provided in both of regions 500a and 500b.

FIG. 14 representatively shows word lines WLa and WLb correspondingly designated by address bits A0 to A11 in regions 500a and 500b. Word drivers WDa and WDb are respectively provided for word lines WLa and WLb.

Word driver WDa receives a block selection signal RAD12 set correspondingly to address bit A12, a word line activation signal RXT, and an address decode signal ADC activated in accordance with a combination of address bits A0 to A11 for driving word line WLa into a selection state when all of these signals are activated. For each of the other word lines provided in region 500a, a word driver is arranged which activates the corresponding word line in accordance with signals as in the case of word driver WDa.

On the other hand, word line driver WDb receives a block selection signal ZRAD12 which is complementary to block selection signal RAD12 in accordance with address bit A12 as well as word line activation signal RXT and address decode signal ADC also applied to word driver WDa for operation.

During normal reading and writing operations, one of block selection signals RAD12 and ZRAD12 is activated (H level) in response to a signal level of address bit A12, and a word line corresponding to address bits A0 to A11 is activated in one of regions 500a and 500b. On the other hand, during a refresh operation, both of block selection signals ZRAD12 and RAD 12 are activated (H level) regardless of the signal level of address bit A12. Thus, in this case, corresponding word lines are activated in regions 500a and 500b in accordance with a combination of address bits A0 to A11. Accordingly, in memory array 500, twice as many word lines are simultaneously activated during the refresh operation as compared with the case of the normal operation. Such a structure ensures a refresh cycle for the memory cell array with a large storage capacity.

FIG. 15 is a timing chart shown in conjunction with a row related operation during a normal operation of memory array 500.

Referring to FIG. 15, /RAS is a row address strobe signal designating activation of a row related operation. /CAS is a column address strobe signal designating activation of a column related operation. A12 represents a signal level of address bit A12, and control signals RASF and CAS are respectively inverted signals of row address strobe signal /RAS and column address strobe signal /CAS, obtained as outputs from a control signal.

A signal ZRASE is an inverted signal of control signal RASF, and a control signal RADE is a row address decode enable signal activated when a prescribed period of time is elapsed after activation of row address strobe signal /RAS in response to the start of the row related operation.

One of block selection signals ZRAD12 and RAD12 is activated in accordance with the signal level of address bit A12 during the normal operation. Control signals RXT and S0N are respectively a word line activation signal and a sense amplifier activation signal. Activation timings for signals RXT and S0N are controlled such that the word line and the sense amplifier are suitably timed to be activated in response to the start of the row related operation.

A refresh control signal ZCBR is inactivated (H level) during the normal operation and activated (L level) for designating a refresh operation for CBR refresh. Thus, when refresh control signal ZCBR is activated, both of block selection signals ZRAD12 and RAD12 are activated (H level). When refresh control signal ZCBR is inactivated (H level), one of block selection signals ZRAD12 and RAD12 is activated (H level) in accordance with the signal level of address bit A12.

Thus, when row address strobe signal /RAS is activated and the row related operation starts at a time t0, responsively, control signals RASF and ZRASE are sequentially activated (level) and row address decode enable signal RADE, word line activation signal RXT and sense amplifier activation signal S0N are activated. Block selection signal ZRAD12 corresponding to the signal level (L level) of address A12 is activated (H level) in response to activation of row address decode enable signal RADE, and RAD 12 is maintained in an inactivation state (L level). Thus, only the word lines in region 500b are subjected to activation.

Further, the column related operation starts in response to activation of column address strobe signal /CAS at a time t1, and a data reading/writing operation is performed on memory cells in region 500b selected by the address signal.

FIG. 16 is a circuit diagram showing a structure of a conventional refresh control circuit 510 generating a refresh control signal ZCBR.

Referring to FIG. 16, refresh control circuit 510 includes an SR flip flop 512 receiving two inputs of control signals CAS and RASF, and an SR flip flop 514 receiving two inputs of control signal RASF and control signal ZRF which is an output from SR flip flop 512. SR flip flop 514 outputs a refresh control signal ZCBR.

FIG. 17A shows states of control signal ZRF in relation to a combination of control signals RASF and CAS, corresponding to a truth table of SR flip flop 512. Similarly, FIG. 17B shows states of refresh control signal ZCBR in relation to a combination of control signals ZRF and RASF, corresponding to a truth table of SR flip flop 514.

FIG. 18 is a timing chart shown in conjunction with a row related operation for CBR refresh in memory array 500.

Referring to FIG. 18, during a CBR refresh operation, column address strobe signal /CAS is activated prior to activation of row address strobe signal /RAS (time t0). This corresponds to the state in which control signal CAS is risen to the H level when control signal RASF is at the L level, so that control signal ZRF is correspondingly set at the L level.

Thereafter, when control signal RASF changes from the L to H level in response to activation of row address strobe signal /RAS (time t1), refresh control signal ZCBR is activated (L level) while control signal ZRF is maintained at the L level.

In response to activation of refresh control signal ZCBR, block selection signal ZRAD12 is activated (H level) in addition to block selection signal ZRAD12 activated in response to the signal level of address bit A12. In this state, control signals RXD and S0N are sequentially activated, so that corresponding word lines and sense amplifiers are also sequentially activated. Thus, in each of two regions 500a and 500b shown in FIG. 14, a refresh operation can be performed on the corresponding word lines.

The CBR refresh operation, once started, completes when control signal ZRF is brought back into the inactivation state (H level) in response to inactivation of row address strobe signal /CAS after control signal ZRF is inactivated (H level) in response to inactivation of column address strobe signal /CAS.

Referring to FIG. 17A and 17B, during the normal operation when row address strobe signal /RAS is activated prior to column address strobe signal /CAS, even if control signal RASF is activated (H level), control signal ZRF and a refresh control signal ZCBR are maintained in the inactivation state (H level), so that the normal reading/writing operation is performed.

In the structure of refresh control circuit 510 shown in FIG. 16, 5 however, if noise is superimposed on row address strobe signal /RAS when both of row address strobe signal /RAS and column address strobe signal /CAS are activated (L level) during the normal operation, erroneous activation of the refresh control signal may be caused, resulting in disruption of data in the memory cell. This will now be described in detail.

Returning to FIG. 15, assume that noise is superimposed on row address strobe signal /RAS at a time t2 and the row address strobe signal /RAS is temporarily brought into the inactive state (H level) and then returns back to the active state (L level). The levels of control signals RASF and /ZRASE change in response to the noise.

In the normal operation, both of control signal ZRF and refresh control signal ZCBR are at the H level at t2 at which the noise is caused. Thus, if the noise is superimposed on row address strobe signal /RAS thereby bringing and control signal RASF to the L level, the level of control signal ZRF responsively changes from H to L level.

Accordingly, if row address strobe signal /RAS returns back to the active state (L level), control signal RASF also returns back to the H level from the L level. Responsively, refresh control signal ZCBR is activated (L level). Thus, block selection signal RAD12 is newly activated in addition to block selection signal ZRAD12 which has been activated in response to the signal level of address bit A12. Responsively, the word line in region 500a, which is not essentially subjected to activation, is activated.

In region 500a which is not essentially subjected to activation, if the word line is activated when the sense amplifier is not activated, the sense amplifier may be activated at an incorrect timing before electric charges corresponding to stored information and accumulated in the memory cells connected to the word line are sufficiently transmitted to the bit line, thereby disrupting data in the memory cell. On the other hand, if the word line is activated in the state in which the sense amplifier for region 500a is activated, the data in the memory cell connected to the word line may be disrupted as electric charges from the memory cells are not amplified by the sense amplifier.

FIGS. 19A and 19B are timing charts shown in conjunction with activation timings of the word line and sense amplifier as well as data reading.

FIGS. 19A and 19B show an operation of reading retained data to the bit line by activation of the bit line and sense amplifier for the memory cell in which data at the H level is retained. In the drawing, $V_{WL}$ represents a voltage level of the word line, control signal S0N represents an activation signal for the sense amplifier, and $V_{BL}$ represents a voltage level of the bit line.

FIG. 19A shows a correct activation timing at which the word line is activated prior to activation of the sense amplifier. Referring to FIG. 19A, bit line voltage VBL is set at a precharge potential Vpc before a time ta at which the word line is activated. Upon activation of the word line at ta, bit line voltage VBL is changed to reflect the H level of data retained in the memory cell.

The sense amplifier operates to amplify a potential difference between a complementary pair of bit lines in response to activation of sense amplifier activation signal S0N at a time tb, so that bit line voltage VBL is amplified to attain to the H level. Because of an appropriate time lag between ta and tb, even if the level of the bit line voltage gradually changes toward the direction opposite to the voltage level of the data retained in the memory cell immediately after the word line is driven, the sense amplifier is activated after the voltage level corresponding to the retained data appears as a bit line voltage. Thus, the voltage level of the data retained in the memory cell can correctly be amplified by the sense amplifier.

On the other hand, referring to FIG. 19B, bit line voltage VBL is changed to attain to the H or L level after a time tc at which the amplifier has already been activated. In this state, if the word line is selected at a time td so that electric charges move from the memory cell in response to the increase in word line voltage VWL, data of the memory cell is disadvantageously disrupted and lost due to a large driving current of the sense amplifier.

More specifically, when the CBR refresh operation is controlled by conventional refresh control circuit 510 shown in FIG. 16 and both of row address strobe signal /RAS and column address strobe signal /CAS are in the active state (L level) during a normal operation, if noise is caused to row address strobe signal /RAS, a refresh control signal may erroneously be activated, thereby disadvantageously causing disruption of data in the memory cell.

SUMMARY OF THE INVENTION

An object of the present invention is to provide a semiconductor memory device capable of preventing malfunction during a refresh operation even if pulse-like noise is superimposed on a control signal.

In short, the present invention is a semiconductor memory device starting a refresh operation in accordance with an activation order of first and second control signals, and includes a control circuit, a memory cell array, and a row selection circuit.

The control circuit generates an internal control signal activated/inactivated respectively in accordance with activation/inactivation of the second control signal, and designates start and end of the refresh operation in accordance with the first and second control signals as well as the internal control signal. The memory cell array has a plurality of memory cells arranged in a matrix and is divided into a plurality of row blocks in a direction of rows of the memory cells. Each of the plurality of row blocks has a plurality of word lines arranged correspondingly to a plurality of memory cell rows.

The row selection circuit selects one of the memory cell rows in each of the plurality of row blocks in accordance with an address signal. The row selection circuit is controlled by the control circuit for activating one of the plurality of word lines corresponding to the selected memory cell row in at least one of the plurality of row blocks during a normal reading/writing operation, and activating one of the plurality of word lines corresponding to the selected memory cell row in each of the greater number of row blocks during a refresh operation than during the normal reading/writing operation.

Therefore, a main advantage of the present invention is that the start and end of the refresh operation is designated in accordance with a signal level of the internal control signal in addition to a combination of signal levels of the first and second control signals essentially required for designating a precharge operation, so that a refresh cycle can be ensured while preventing disruption of data in the memory cell even when noise is superimposed on the control signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
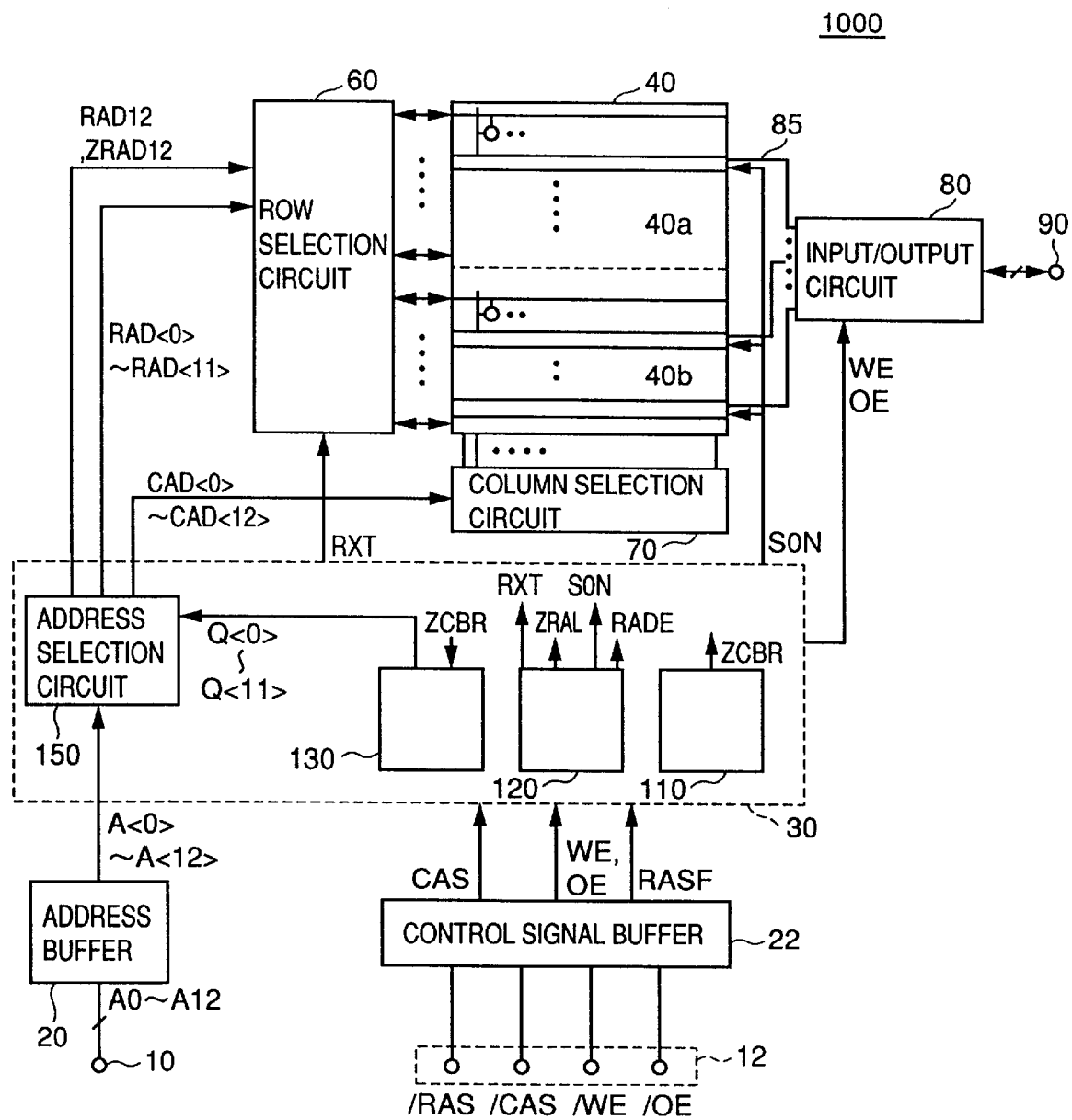
FIG. 1 is a block diagram showing an overall structure of a semiconductor memory device 1000 according to the first embodiment of the present invention.

Now, embodiments of the present invention will be described in detail with reference to the drawings. It is noted that the same or corresponding portions in the drawings are denoted by the same reference characters.

First Embodiment

Referring to FIG. 1, semiconductor memory device 1000 is provided having a memory cell array 40 of 64-Mbits addressed by address signals of 13 bits. While a structure of memory cell array 40 will later be described in detail, here, assume that it is divided into two regions 40a and 40b as in the conventional case. Of address bits A0 to A12 of address signals, A12 is an address signal for selecting one of regions 40a and 40b for row selection.

It is noted that, as will be apparent from the following description, there are 13 bits of address signals A0 to A12 and the memory cell array corresponds to 64-Mbits merely as an example. The present invention can be applied to memory cell arrays of various sizes addressed by an address signal of a plurality of bits.

Referring to FIG. 1, semiconductor memory device 1000 includes: an address input terminal 10 receiving address bits A0 to A12 of the address signal; a control signal input terminal 12 receiving control signals such as a row address strobe signal /RAS, column address strobe signal /CAS, write enable signal /WE, output enable signal /OE and the like; an address buffer 20 provided correspondingly to address input terminal 10; and a control signal buffer 22 provided correspondingly to control signal input terminal 12. Control signal buffer 22 outputs control signals RASF, CAS, WE and OE, which are inverted signals of the control signals input to control signal input terminal 12.

Semiconductor memory device 1000 further includes: a control circuit 30 receiving a control signal output from control signal buffer 22 for controlling the overall reading/writing operation and refresh operation of semiconductor memory device 1000; a memory cell array 40 having a plurality of memory cells arranged in a matrix; a row selection circuit 60 for selecting rows of the memory cell; and a column selection circuit 70 selecting columns of the memory cells.

Next, the structure of memory cell array 40 will be described in detail.

Figure 2:
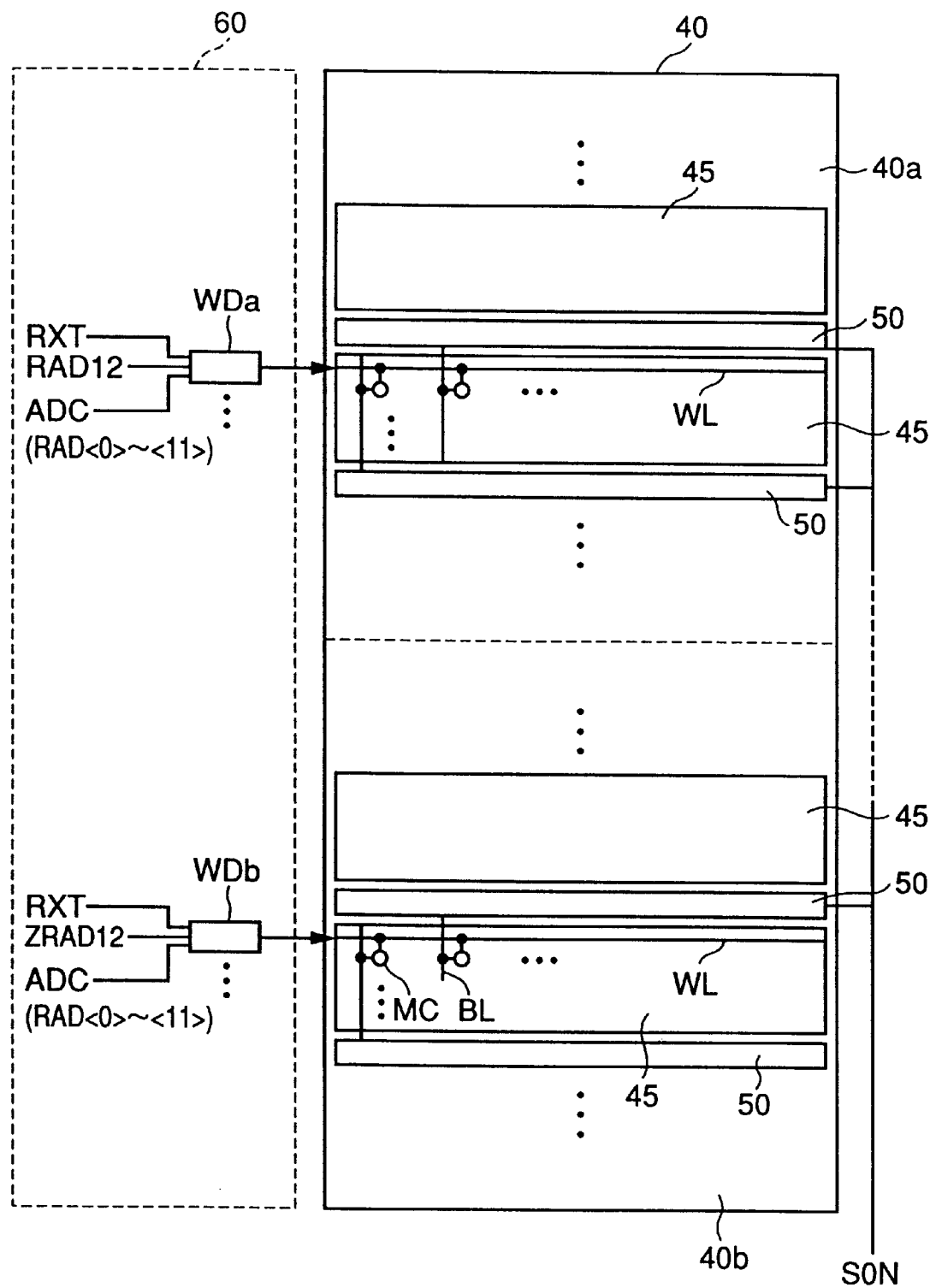
FIG. 2 is a block diagram shown in conjunction with a structure of a memory cell array 40.

Referring to FIG. 2, memory cell array 40 is divided into a plurality of row blocks 45 in a row direction. Assume that memory cell array 40 is divided into two regions 40a and 40b as in the conventional case. Thus, each of regions 40a and 40b has the same number of row blocks 45.

Each of row blocks 45 has a plurality of memory cells arranged in a matrix. In each row blocks 45, a word line is arranged for every row of the memory cells, and a pair of bit lines BL and /BL (not shown) are arranged for every column of the memory cells. Arranged in a region adjacent to row block 45 in a column direction is a sense I/O circuit 50 which amplifies a voltage caused between the pair of bit lines in accordance with selection of the word lines and is controlled by column selection circuit 70 for transmitting the amplified data signal to an I/O line 85. Each sense I/O circuit 50 has a so-called shared amplifier structure, being shared by two adjacent row blocks 45. Sense I/O circuit 50 is activated by sense amplifier activation signal S0N output from control circuit 30. Sense amplifier activation signal S0N is activated upon the start of the row related operation in response to activation of row address strobe signal /RAS. Activation of sense I/O circuit 50 can be performed for every pair of two regions 40a, 40b or for every row block 45.

Row selection circuit 60 includes: a decode circuit (not shown) decoding internal row address bits RAD<0> to RAD<11> which are bits of the internal row address signal output from address selection circuit 150; and word drivers for activating corresponding word lines in accordance with word line activation signal RXT output from control circuit 30, block selection signals RAD12, ZRAD12 output from address selection circuit 150, and decode signal ADC output from the decode circuit.

FIG. 2 representatively shows word lines WLa and WLb selected in respective regions in accordance with the same combination of internal row address bits RAD<0> to RAD<11>. A word driver WDa arranged correspondingly to word line WLa in region 40a operates in response to word line activation signal RXT, address decode signal ADC and block selection signal RAD 12 for activating the word line selected by internal row address when block selection signal RAD12 is in an active state (H level).

Similarly, a word driver WDb activates the word line selected by internal address signals RAD<0> to RAD<11> at a timing designated by control signal RXT when block selection signal ZRAD12 is in the active state (H level).

One of block selection signals RAD 12 and ZRAD 12 is activated (H level) in a complementary manner in accordance with a signal level of address bit A12 during a normal reading/writing operation. When the refresh operation is designated, to ensure the refresh cycle, both of block selection signals RAD12 and ZRAD12 are brought into the active state (H level). In each of regions 40a and 40b, the word lines corresponding to internal address signals RAD<0> to RAD<11> are simultaneously activated.

Referring again to FIG. 1, semiconductor memory device 1000 further includes: an input/output circuit 80 inputting/outputting data to/from sense I/O circuit 50 in memory cell array 40 through I/O line 85; and a data input/output terminal 90 inputting/outputting input/output data with respect to an external portion. Input/output circuit 80 is controlled by control circuit 30 for inputting/outputting data read/written with respect to memory cell array 40 to/from data input/output terminal 90.

Control circuit 30 receives control signals RASF, CAS, WE and OE output from a control signal buffer 22 for outputting an internal control signal for controlling an overall operation of semiconductor memory device 1000.

Control circuit 30 includes: a refresh control circuit 110 generating a refresh control signal ZCBR; row related operation control circuit 120 outputting row address decode enable signal RADE, word line activation signal RXT and sense amplifier activation signal S0N; and an internal refresh address counter 130 outputting address bits Q<0> to Q<11> of an internal refresh address for selecting a word line to be subjected to a refresh operation when the refresh operation is designated.

Control circuit 30 further includes an address selection circuit 150 receiving address bits A<0> to A<12> and internal refresh address bits Q<0> to Q<11> for outputting internal row address bits RAD<0> to RAD<11> and block selection signals RAD12, ZRAD12 for row selection as well as internal column address bits CAD<0> to CAD<12> for column selection.

For row selection, address selection circuit 150 sets signal levels of internal row address bits RAD<0> to RAD<11> in accordance with signal levels of address bits A<0> to A<11> output from address buffer 20 and activates one of block selection signals RAD12 and ZRAD12 in accordance with a signal level of address bit A<12> during the normal operation.

On the other hand, during the refresh operation, address selection circuit 150 sets signal levels of internal row address bits RAD<0> to RAD<11> in accordance with signal levels of internal refresh address bits Q<0>to Q<11> output from internal refresh address counter 130 and activates both of block selection signals RAD12 and ZRAD12.

For column selection, address selection circuit 150 sets signal levels of internal column address bits CAD<0> to CAD<12> in accordance with signal levels of address bits A<0> to A<12> output from address buffer 20. Column selection circuit 70 selects memory cell columns in response to internal column address bits CAD<0> to CAD<12>.

In memory cell array 40 having the above described structure, the word line corresponding to a combination of internal row address bits RAD<0> to RAD<11> is activated in one of regions 40a and 40b in response to the block selection signal during the normal operation, and the word lines corresponding to internal row address bits RAD<0> to RAD<11> is activated in both of regions 40a and 40b during the refresh operation.

Semiconductor memory device 1000 according to the first embodiment is characterized in that a structure of the refresh control circuit is different from that of the conventional case.

Figures 3, 4A, 4B:
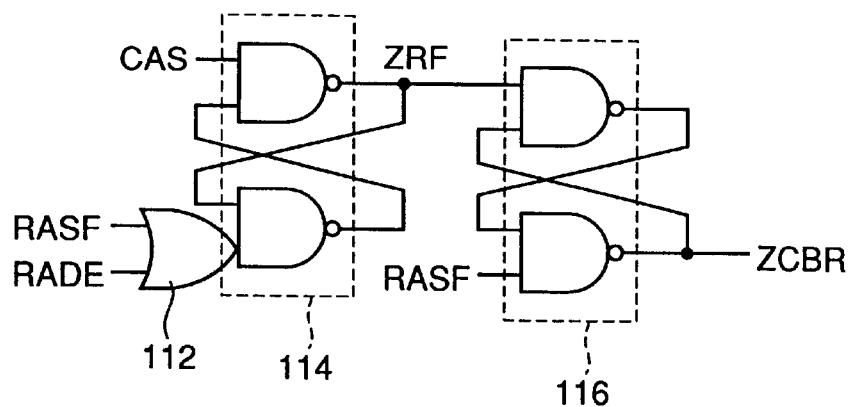
FIG. 3 is a circuit am showing an exemplary structure of a refresh control circuit 110.
FIGS. 4A and 4B are diagrams shown in conjunction with a relationship among control signals in refresh control circuit 110.

FIG. 3 is a circuit diagram showing an exemplary structure of refresh control circuit 110.

Referring to FIG. 3, refresh control circuit 110 includes: a logic gate 112 outputting an OR operation result of control signal RASF and row address decode enable signal RADE which is an internal control signal activated upon the start of the column related operation corresponding to activation of control signal RASF; an SR flip flop 114 receiving two inputs from control signal CAS and an output from logic gate 112; and an SR flip flop 116 receiving two inputs of a signal ZRF, an output from SR flip flop 112, and a control signal RASF. SR flip flop 116 outputs refresh control signal ZCBR.

Figures 16, 17A, 17B:
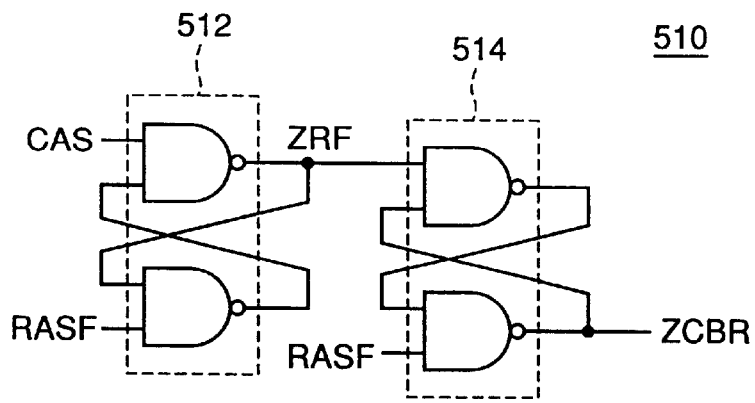
FIG. 16 is a circuit diagram showing a structure of a conventional refresh control circuit 510.
FIGS. 17A and 17B are diagrams shown in conjunction with a relationship among control signals in refresh control circuit 510.
Figure 18:
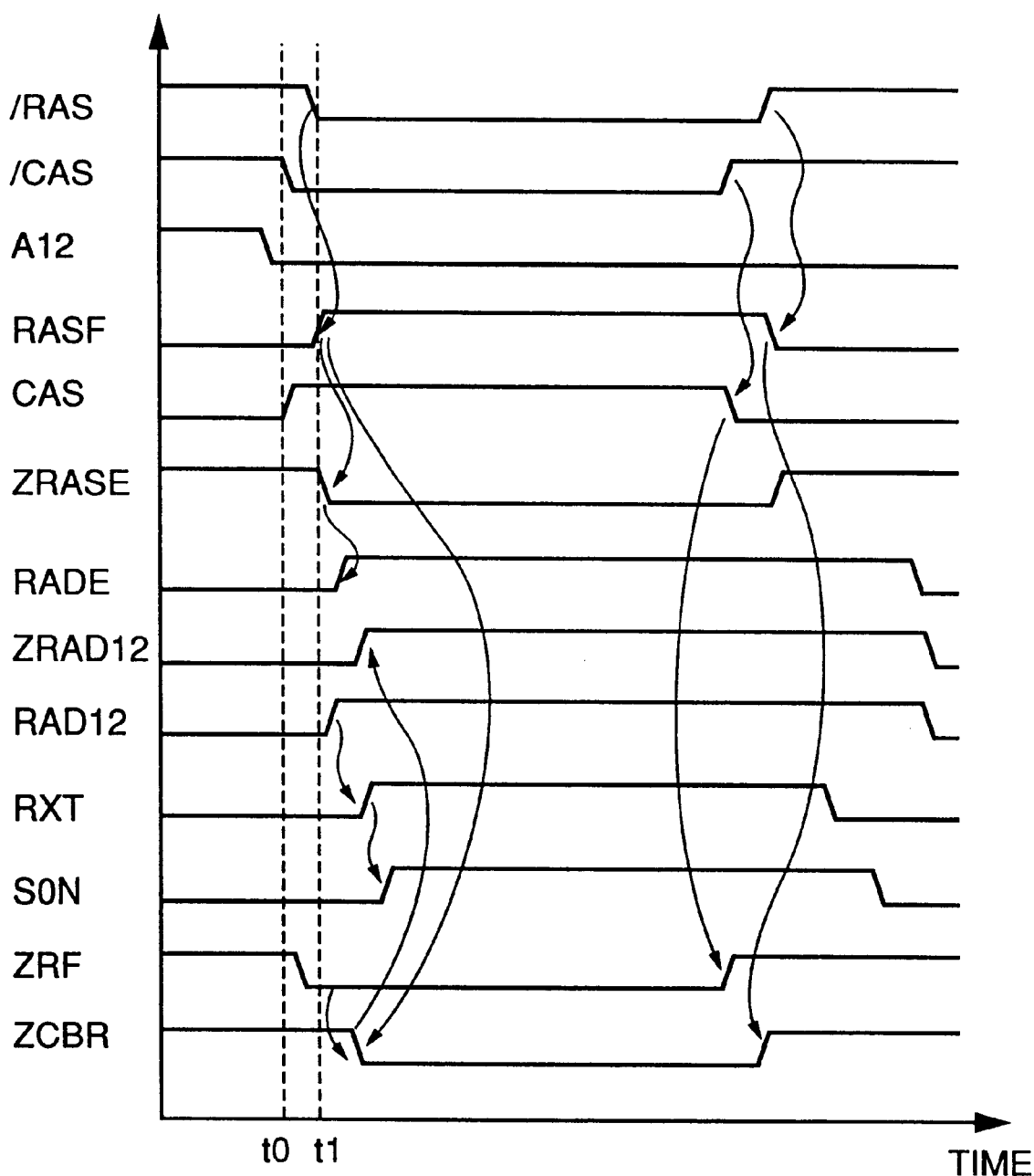
FIG. 18 is a timing chart shown in conjunction with a row related operation during a CBR refresh operation in memory array 500.
Figure 19A:
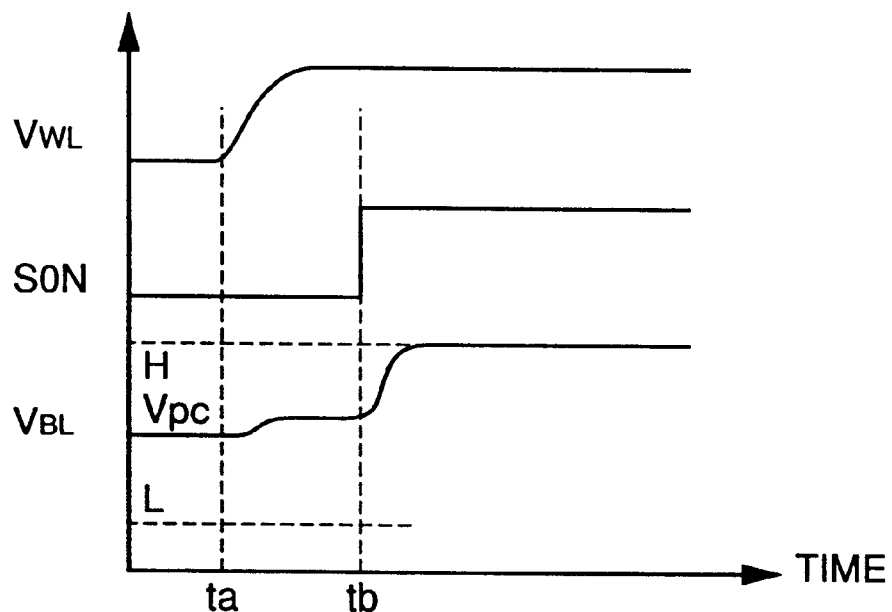
FIGS. 19A and 19B are timing charts shown in conjunction with a relationship among activation timings of the word line and sense amplifier as well as data reading.
Figure 19B:
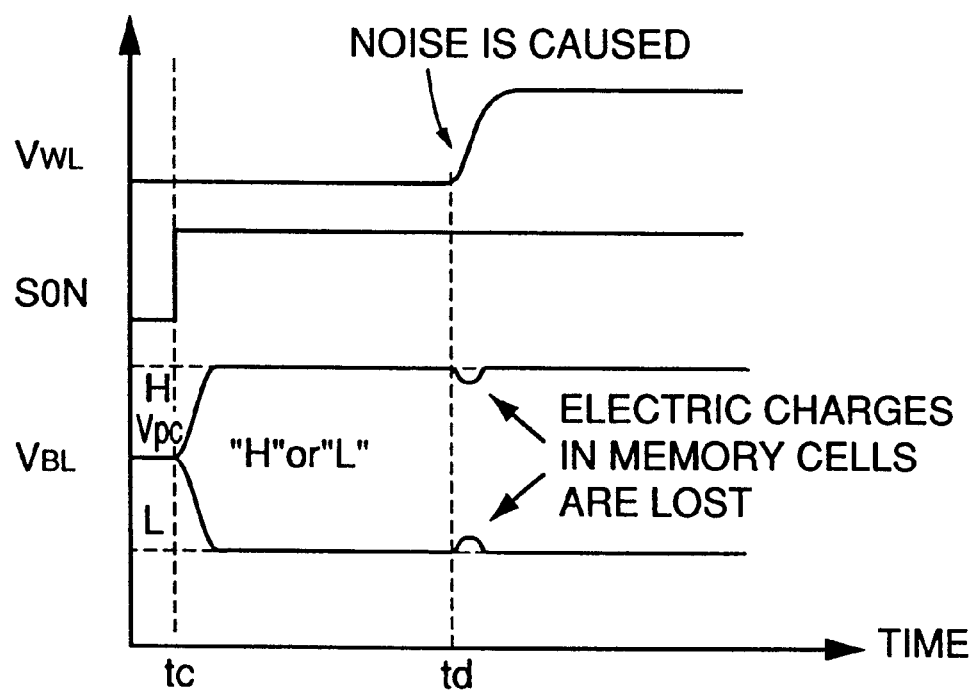

Refresh control circuit 110 is different from conventional refresh control circuit 510 shown in FIG. 16 in that one of inputs to SR flip flop 114 is not directly used as control signal RASF, but the OR operation result of internal control signal RADE activated upon the start of the row related operation and control signal RASF is used FIG. 4A shows states of control signal ZRF with respect to a combination of control signals RASF, RADE and CAS, corresponding to a truth table of SR flip flop 114. Similarly, FIG. 4B shows states of refresh control signal ZCBR with respect to a combination of control signals ZRF and RASF, corresponding to a truth table of SR flip flop 116.

Refresh control circuit 110 performs activation (L level) of control signal ZRF necessary for activation of refresh control signal ZCBR only when both of control signals RASF and RADE are at the L level. In other words, when control signal CAS is at the H level in response to activation of column address strobe signal /CAS, if control signal RADE has been activated, control signal ZRF is not immediately activated even when only control signal RASF changes to the L level. In this respect, it is different from conventional refresh control circuit 510.

Figure 5:
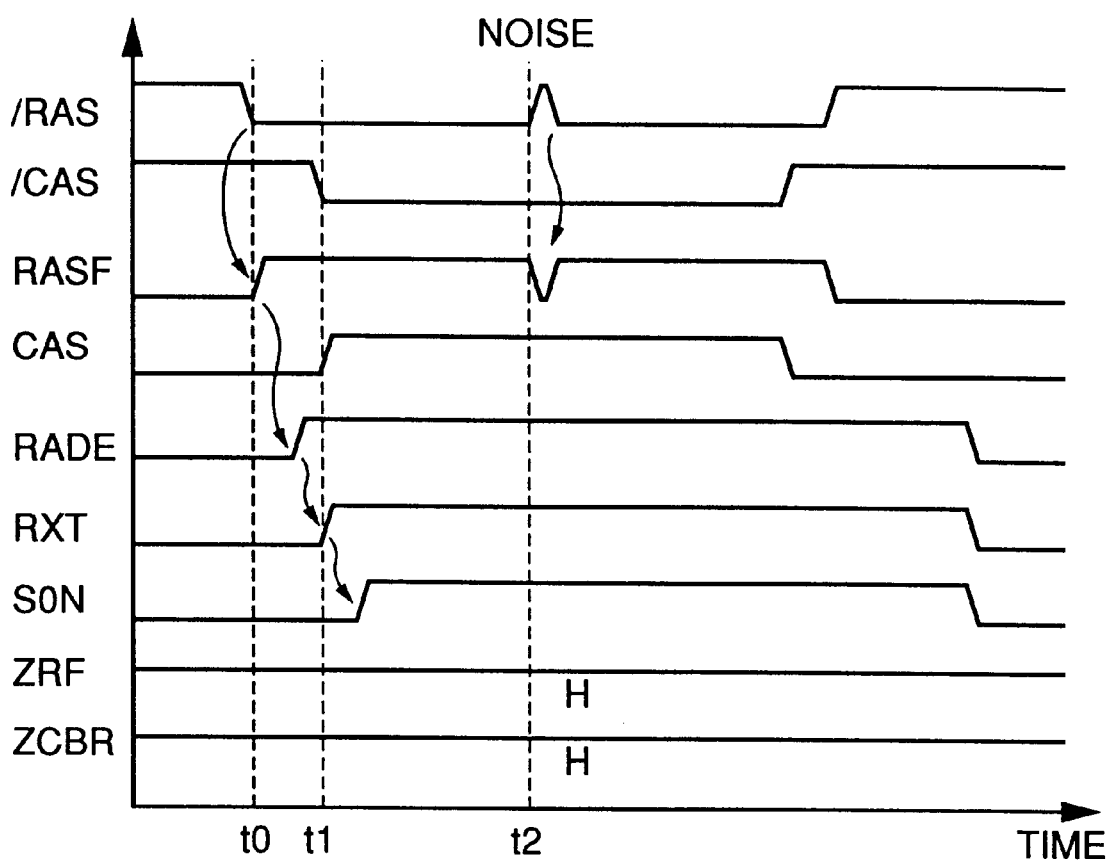
FIG. 5 is a timing chart shown in conjunction with an operation of refresh circuit 110 when noise is superimposed on a signal /RAS.

Referring to FIG. 5, at a time t0, RASF is activated (L level) prior to activation of column address strobe signal /CAS, so that the row related operation starts for a normal reading/writing operation. More specifically, in response to activation (H level) of control signal RASF, which is an inverted signal of row address strobe signal /RAS, row address decode enable signal RADE, word line activation signal RXT and sense amplifier S0N are sequentially activated.

At a time t0, control signal RASF rises to the H level when control signal CAS is in an inactive state (L level), so that control signal ZRF is set at the H level.

At t1 when a prescribed period of time is elapsed after t0 at which the row related operation is started, column address strobe signal /CAS is activated (L level) to activate the column related operation. Accordingly, the column selecting operation is performed, and data reading or writing is performed with respect to the memory cell corresponding to the selected memory cell column of a group of memory cells connected to the selected word line.

At the time, in refresh control circuit 110, although control signal CAS rises to the H level, an output from logic gate 112, the other input to SR flip flop 114, is also at the H level, so that signal ZRF is maintained at the H level. Thus, refresh control signal ZCBR is also maintained in the inactive state (H level), and the refresh operation is not started.

Assume that pulse-like noise is superimposed on row address strobe signal /RAS at a time t2. Responsively, noise is caused to control signal RAS, and the signal level thereof instantly changes from the H to L level and then returns back to the H level.

An operation of refresh control circuit 110 in this state is considered. While the detail will later be given, when the row related operation is once started by Tow address strobe signal /RAS, row address decode enable signal RADE is a signal generated to be maintained in the activation state until the row related operation ends. Accordingly, even when control signal RASF instantly changes to the L level in response to noise at a time t2, internal control signal RADE is maintained at the H level.

Thus, an output from logic gate 112 is maintained at the H level and does not fall to the L level, so that control signal ZRF does not change from the H to L level due to instant noise caused to row address strobe signal /RAS and control signal ZRF is maintained at the H level.

Figure 15:
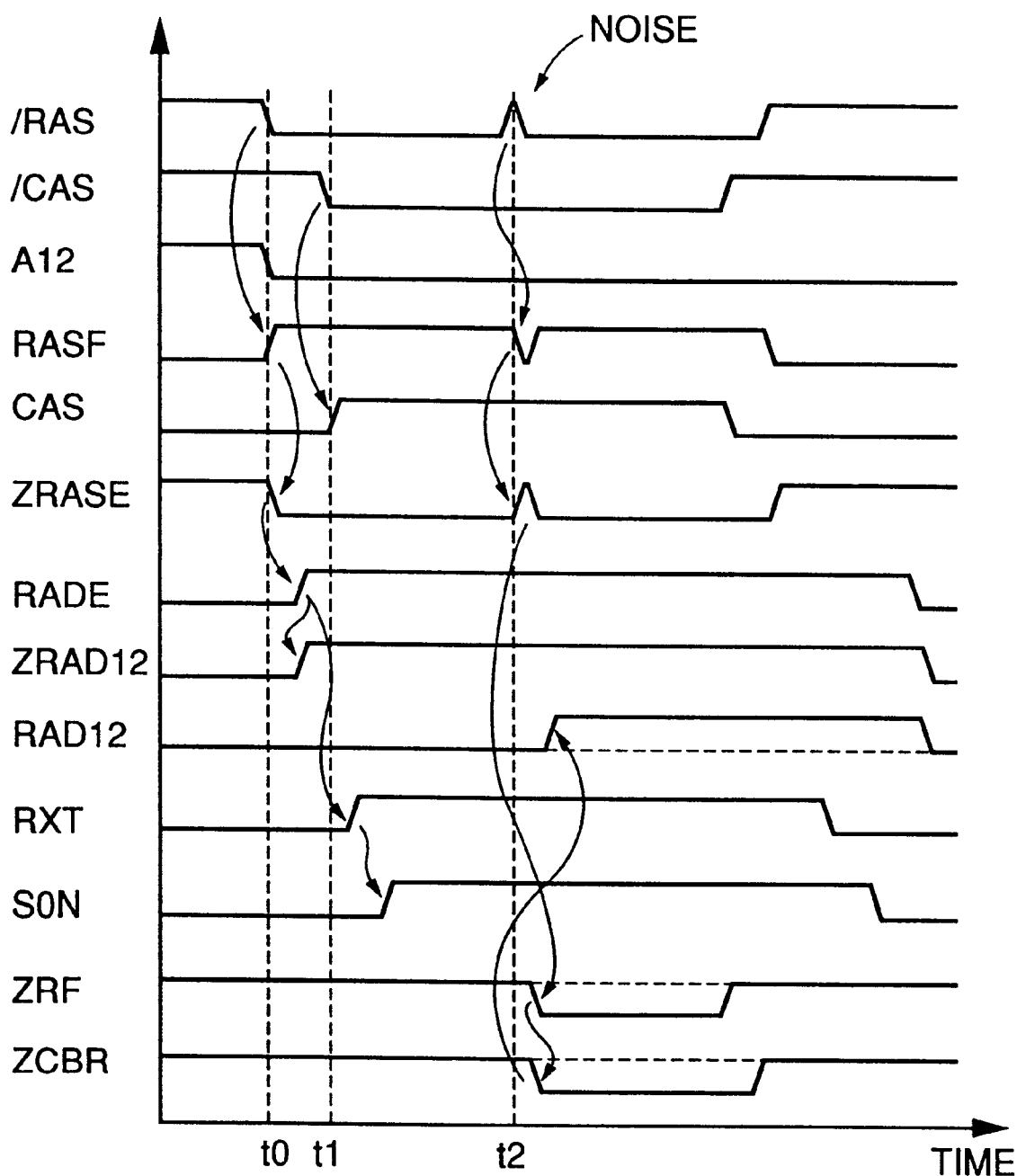
FIG. 15 is a timing chart shown in conjunction with a row related operation during a normal operation in memory array 500.

As control signal ZRF is maintained at the H level, refresh control signal ZCBR, which is in the inactive state (H level) before the noise is caused, is not activated (L level). Therefore, the problem is prevented which is associated with disruption of the data retained in the corresponding memory cell when the noise is caused to row address strobe signal /RAS, a refresh control signal is erroneously activated even during the normal reading/writing operation, and the word line is newly selected, as described with reference to FIG. 15.

Next, exemplary structures of circuits included in control circuit 30 will be described in detail.

Figure 6:
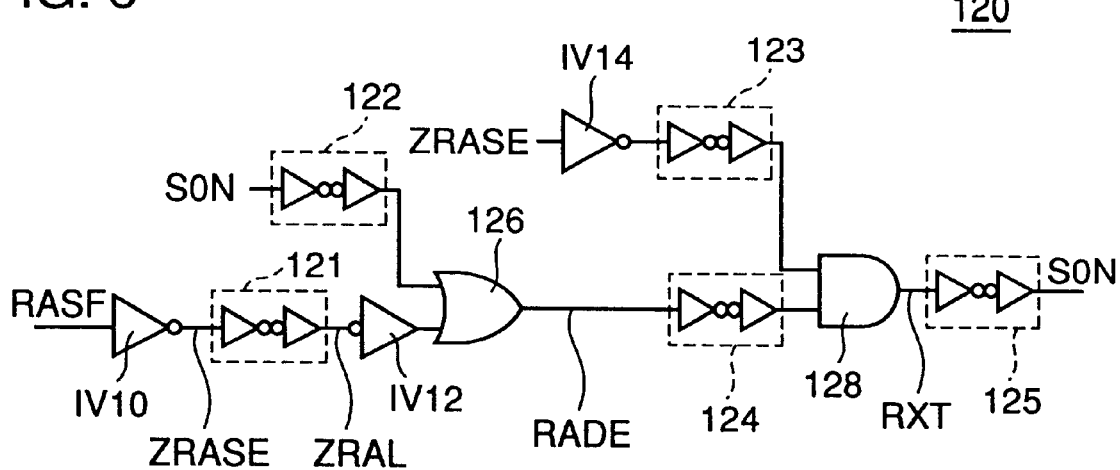
FIG. 6 is a circuit diagram showing an exemplary structure of a row related operation control circuit 120.

FIG. 6 is a circuit diagram showing an exemplary structure of row related operation control circuit 120.

Row related operation control circuit 120 generates an internal control signal associated with the row related operation in response to control signal RASF activated in accordance with row address strobe signal /RAS.

Referring to FIG. 6, row related control circuit 120 includes: an inverter IV10 inverting control signal RASF and outputting control signal ZRASE; a buffer 121 receiving control signal ZRASE for outputting control signal ZRAL for latching address bits A<0> to A<11>; an inverter IV12 inverting and outputting control signal ZRAL; a buffer 122 delaying and outputting control signal S0N; and a logic gate 126 outputting an OR operation result receiving outputs from buffer 122 and inverter IV12 as two inputs. Logic gate 126 outputs row address decode enable signal RADE for designating the start of decoding a row address.

Row related operation control circuit 120 further includes: a buffer 124 delaying and outputting row address decode enable signal RADE; an inverter IV14 inverting control signal ZRASE; a buffer 123 delaying an output from inverter IV14; and a logic gate 128 outputting an AND operation result of outputs from buffers 123 and 124. Logic gate 128 outputs word line activation signal RXT.

Word line activation signal RXT is input to buffer 125. Buffer 125 delays word line activation signal RXT for outputting sense amplifier activation signal S0N.

In the above described circuit structure, in response to control signal RAS set at the H level upon activation (L level) of row address strobe signal /RAS, row address decode enable signal RADE, word line activation signal RXT and sense amplifier activation signal S0N are sequentially activated (H level) after a delay time caused by the inverter and buffer. On the other hand, when row address strobe signal /RAS is inactivated (H level), word line activation signal RXT and sense amplifier activation signal S0N are inactivated (L level) when a prescribed period of time caused by the inverter and buffer is elapsed in accordance with the change of control signal RASF to the L level.

In response to inactivation of sense amplifier activation signal S0N, output from logic gate 126 also changes to the L level. Responsively, row address decode enable signal RADE is also inactivated (L level).

Once sense amplifier activation signal S0N is activated, even if a signal level of control signal RAS changes due to noise, taking an OR with respect to control signal S0N, which has already been changed to the H level by logic gate 126, prevents row address decode enable signal RADE from changing to the L level until the end the sense operation.

Therefore, refresh control signal ZCBR is generated by using control signal RADE maintained in the active state during the row related operation while not being affected by noise superimposed on row address strobe signal /RAS. Accordingly, even when the noise is superimposed on row address strobe signal /RAS during the normal operation, if the noise corresponds to a short period of time within a prescribed delay time to the end of the sense amplifier operation, refresh control signal ZCBR is not disadvantageously activated.

In addition, also for word line activation signal RXT and sense amplifier activation signal S0N, the influence of a change in signal level of row address strobe signal /RAS does not appear until a prescribed delay time caused by the inverter and buffer is elapsed. Thus, if the superimposed noise corresponds to a short period of time, the possibility that the noise affects at the same timing as row address strobe signal /RAS, word line activation signal RXT and sense amplifier activation signal S0N is low.

It is noted that the structure of row related operation control circuit 120 is not limited to that shown in FIG. 6. An arbitrary circuit structure may be used as long as it can activate/inactivate the internal control signal associated with the row related operation at a prescribed timing shown in FIG. 5.

Figure 7:
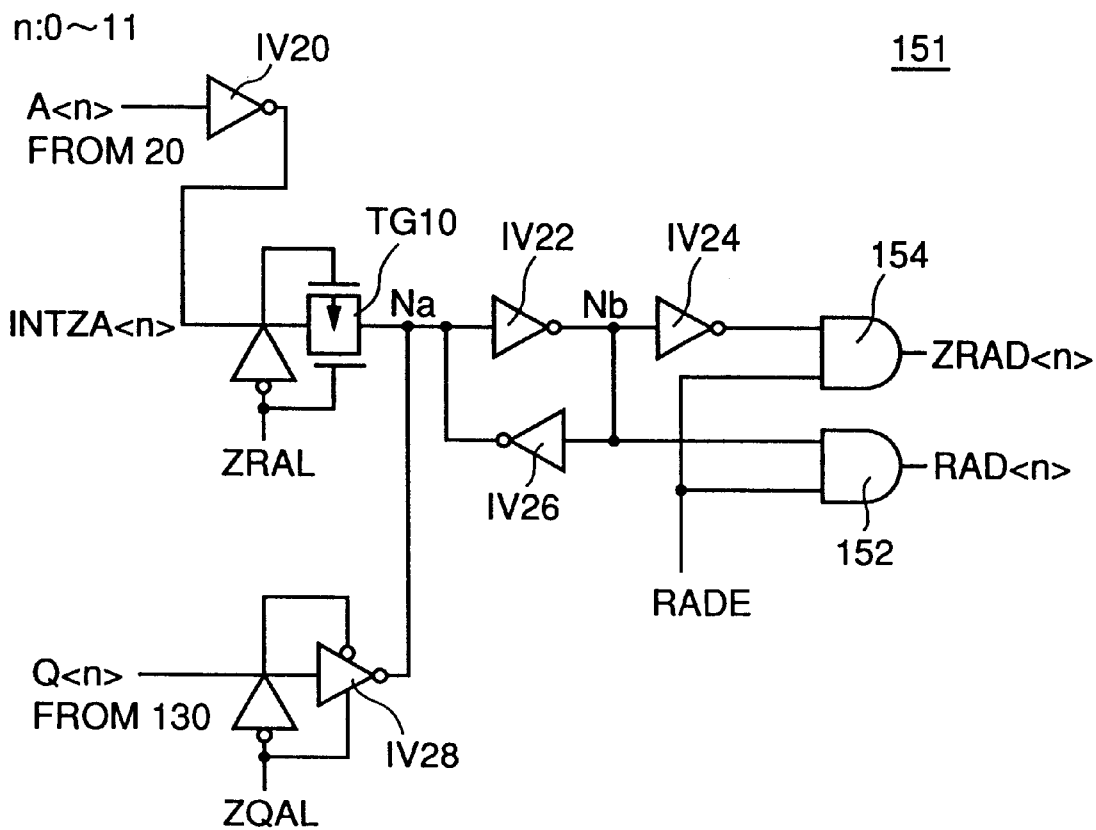
FIG. 7 is a circuit diagram showing an exemplary structure of an internal address generating circuit 151.

FIG. 7 is a circuit diagram showing an exemplary structure of an internal address generating circuit 151 generating internal row address bits RAD<0> to RAD<11> included in the address selection circuit.

Internal address generating circuit 151 selectively latches one of a group of address bits A<0> to A<11> applied from address buffer 20 and a group of internal refresh address bits Q<0> to Q<11> applied from internal refresh address counter 130 for outputting them as internal row address bits RAD<0> to RAD<11>.

FIG. 7 shows an exemplary structure of an internal address generating circuit corresponding to the nth address bit (n: an integer from 0 to 11).

Referring to FIG. 7, internal address generating circuit 151 includes: an inverter IV20 inverting a signal level of address bit A<n> applied from address buffer 20; a transfer gate TG10 connected between inverter IV20 and node Na; and a clocked inverter IV28 inverting a signal level of an internal refresh address bit Q<n> applied from internal refresh address counter 130.

Transfer gate TG10 is turned on/off in response to control signal ZRAL generated by row related operation control circuit 120. Clocked inverter IV28 is activated in response to control signal ZQAL.

Internal address generating circuit 151 further includes: an inverter IV22 inverting a signal level of node Na and outputting it to a node Nb; an inverter IV26 provided to form a latch circuit with inverter IV22; an inverter IV24 inverting a signal level of node Nb; a logic gate 152 outputting an AND operation result of the signal level at node Nb and the signal level of row address decode enable signal RADE as internal row address bit RAD<n>; and a logic gate 154 outputting an AND operation result obtained by two inputs of row address decode enable signal RADE and an output signal from inverter IV24 as an inverted signal ZRAD<n> of the internal row address bit.

When transfer gate TG10 is turned on, the signal level of address bits A<n> is latched at node Nb by inverters IV22 and IV26. On the other hand, when clocked inverter IV28 is activated, the signal level of internal refresh address bits Q<n> is latched at node Nb. Logic gate 152 is responsive to activation of row address decode enable signal RADE for outputting the signal level of node Nb as internal address signal RAD<n>.

Then, control signal ZQAL will be described.

Figure 8:
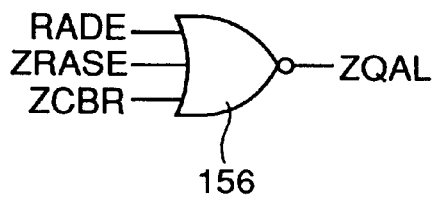
FIG. 8 is a diagram shown in conjunction with a logic gate 156 outputting a control signal ZQAL.

Referring to FIG. 8, logic gate 156 outputs as a control signal ZQAL an NOR calculate result obtained by three inputs of row address decode enable signals RADE, a control signal ZRASE which is an inverted signal of control signal RASF, and a refresh control signal ZCBR. Thus, control signal ZQAL is activated (H level) and clocked inverter IV28 operates only when all of these three inputs are at the L level.

Figure 9:
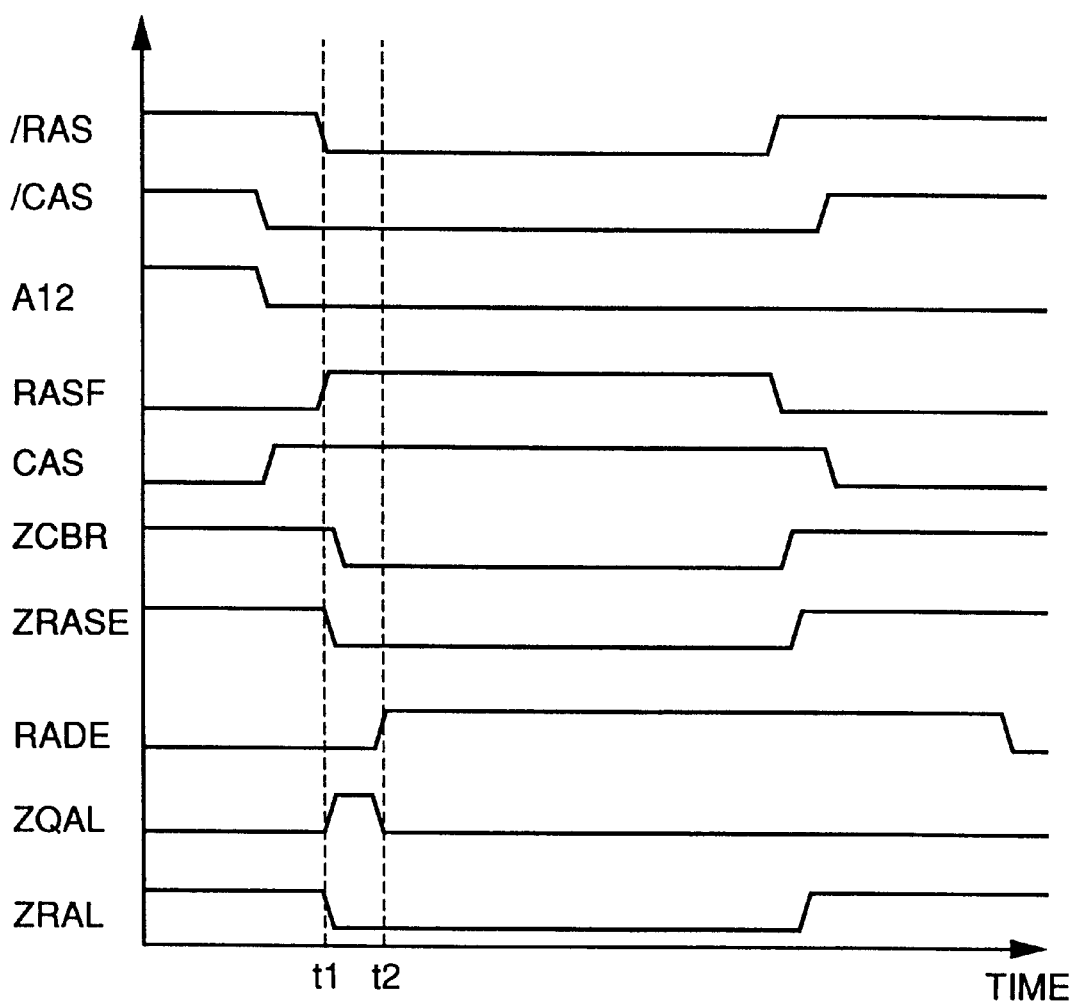
FIG. 9 is a timing chart shown in conjunction with states of control signals during a CBR refresh operation.

Referring to FIG. 9, row address strobe signal /RAS is activated (L level) at t1 after column address strobe signal /CAS is activated (L level), so that the CBR refresh operation starts and refresh control signal ZCBR is activated (L level).

On the other hand, control signal RASF changes to the H level in response to activation of row address strobe signal /RAS and control signal ZRASE changes to the L level, so that the row related operation starts.

Row address decode enable signal RADE is maintained at the L level until t2 when a prescribed period of time is elapsed after the row related operation is started, and activated (H level) at t2. Thus, between t1 and t2, control signal ZQAL is activated (H level) and internal refresh address bit Q<n> is transmitted to nodes Na and Nb and latched thereat.

On the other hand, transfer gate TG10 is turned on when control signal ZRAL is at the H level. More specifically, control signal ZRAL receives a signal level of an address bit input from an address input terminal through address buffer 20 and latches it at nodes Na and Nb prior to activation of row address strobe signal /RAS, i.e., before the row related operation is started.

In the above described structure, during the normal operation, internal refresh address bit Q<n> is not transmitted to nodes Na and Nb, and internal row address bit RAD<n> is set in accordance with a signal level of the externally input address bit. On the other hand, when the refresh operation is started in response to activation of row address strobe signal /RAS, control signal ZRAL changes to the H level and transfer gate TG10 is turned off, while clocked inverter IV28 operates, the signal level of internal refresh address bit Q<n> is transmitted to node Nb and, responsively, internal row address bit RAD<n> is set.

Thus, row selection circuit 60 receiving internal row address bits RAD<0> to RAD<11> performs row selection in response to the externally input address bit during the normal operation, and performs row selection in response to internal refresh address bits Q<0> to Q<11> transmitted from internal refresh address counter 130 during the refresh operation.

Figure 10:
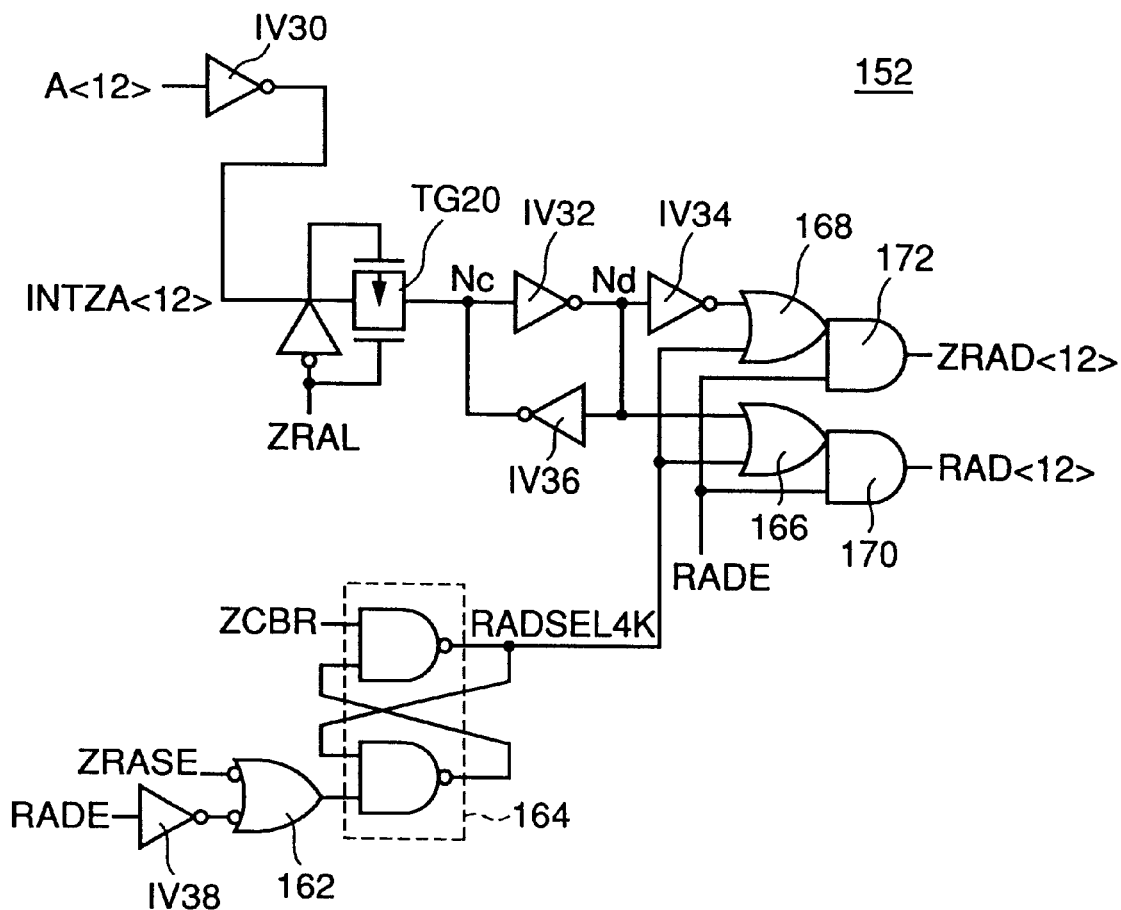
FIG. 10 is a circuit diagram showing an exemplary structure of a block select signal generating circuit 152.

FIG. 10 is a circuit diagram showing an exemplary structure of a block selection signal generating circuit 152 included in address selection circuit 150.

Referring to FIG. 10, block selection signal generating circuit 152 includes: an inverter IV30 inverting a signal level of address bit A<12> output from address buffer 20 in response to the last bit A12 of the address signal used for selecting a block in row selection; a transfer gate TG20 connected between inverter IV30 and node Nc; an inverter IV32 inverting a signal level of node Nc and outputting it to a node Nd; an inverter IV36 arranged to form a latch circuit with inverter IV32; and an inverter IV34 inverting a signal level at node Nd.

Transfer gate TG20 is turned on when control signal ZRAL is at the H level, and turned off when the row related operation is started and control signal ZRAL changes to the L level. When transfer gate TG20 is turned on, the signal level of address bit A<12> output from address buffer 20 is latched at node Nd.

Block selection signal generating circuit 152 further includes; an inverter IV38 inverting and outputting a row address decode enable signal RADE; a logic gate 162 outputting an OR operation result obtained by two inputs of an inverted signal of an output from inverter IV38 and an inverted signal of control signal ZRASE; and an SR flip flop 164 receiving two inputs of a refresh control signal ZCBR and an output from logic gate 162. SR flip flop 164 outputs a control signal RADSEL4K. Control signal RADSEL4K is responsive to activation (L level) of refresh control signal ZCBR and set at the H level.

Block selection signal generating circuit 152 further includes: a logic gate 166 outputting an OR operation result obtained by two inputs of a signal level at node Nd and control signal RADSEL4K; a logic gate 168 outputting an OR operation result obtained by two inputs of an output signal from inverter IV34 and control signal RADSEL4K; a logic gate 170 outputting an AND operation result obtained by two inputs of an output from logic gate 166 and row address decode enable signal RADE; and a logic gate 172 outputting an AND operation result obtained by two inputs of an output from logic gate 168 and row address decode enable signal RADE. Logic gate 170 outputs a block selection signal RAD<12>, whereas logic gate 172 outputs a block selection signal ZRAD<12>.

When control signal RADSEL4K is activated (H level) in response to activation (L level) of refresh control signal ZCBR, both outputs from logic gates 166 and 168 attain to the H level. Thus, block selection signals RAD<12> and ZRAD<12> are both activated regardless of the signal level of address bit A<12> at a timing at which row address decode enable signal RADE is activated (H level).

On the other hand, during the normal operation, RADSEL4K is set at the L level, so that outputs from logic gates 166 and 168 are respectively set at the signal level of address bit A<12> and an inverted level thereof. Accordingly, upon activation of row address decode enable signal RADE, one of block selection signals RAD<12> and ZRAD<12> is activated (H level) in accordance with the signal level of address bit A<12>.

Therefore, as described in the background-of-art section, when refresh control signal ZCBR is instantly activated (L level) in response to the noise caused to row address strobe signal /RAS during the normal operation, control signal RADSEL4K is responsively set at the H level. As a result, both of block selection signals RAD<12> and ZRAD<12> are activated even during the normal operation, thereby disrupting data retained in the memory cell.

It is noted that exemplary circuit structures of internal address generating circuit 151 and block selection signal generating circuit 152, respectively shown in FIGS. 7 and 10, are merely examples. Other circuit structures may be employed as long as they can change the selecting manner of internal row address bits RAD<0> to RAD<11> and block selection signals RAD12, ZRAD12 as described above during the normal operation and the refresh operation. In the first embodiment, refresh control circuit 110 has the structure shown in FIG. 3. Thus, refresh control signal ZCBR is not erroneously activated even if the noise is caused to row address strobe signal /RAS during the normal operation. Accordingly, block selection signal generating circuit 152 does not erroneously activate both block selection signals, and the problem associated with the conventional case is above avoided.

It is noted that, in the first embodiment, the structure in which the memory cell array is divided into two portions and one of these regions is selected using the last bit of the address signal as a block selection signal. However, such control of the block selection signal using at least one bit of the address signal is merely an example, and an independent control signal may be provided and externally input. In addition, the bit number of the control signal for block selection can be increased, so that the memory cell array is correspondingly divided into a greater number of portions.

As described above, in the first embodiment, the start of the CBR refresh operation is controlled by using an existing internal control signal used for control of the row related operation, so that malfunction in the CBR refresh operation when the noise is caused to row address strobe signal /RAS is prevented.

First Modification of First Embodiment

In the first embodiment, refresh control signal ZCBR is controlled by row address decode enable signal RADE which is an internal control signal associated with the row related operation, and malfunction in the CBR refresh operation is prevented.

Other internal control signals can be used to prevent malfunction in the CBR refresh operation as long as they are brought into the active state upon activation of row address strobe signal /RAS and maintained in the active state when the row address strobe signal is in the active state. A structure of the refresh control circuit using other internal control signals will be described as a modification of the first embodiment.

Figure 11:
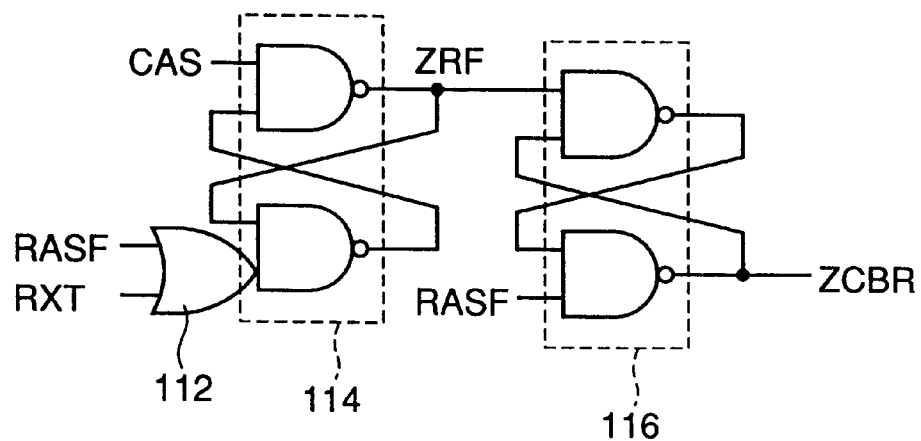
FIG. 11 is a circuit diagram showing an exemplary structure of a refresh control circuit 210 according to the first modification of the first embodiment.

Referring to FIG. 11, refresh control circuit 210 according to the first modification of the first embodiment is different from refresh control circuit 110 described with reference to FIG. 3 in that one of outputs from logic gate 112 is word line activation signal RXT instead of row address decode enable signal RADE. The other parts of the structure and operation are the same as those of semiconductor memory device 1000 in accordance with the first embodiment and therefore description thereof will not be repeated.

Word line activation signal RXT is activated/inactivated in response to activation/inactivation of row address strobe signal /RAS, respectively. The signal level of word line activation signal RXT corresponds row address strobe signal /RAS being delayed by the inverter and delay circuit.

Thus, even when the noise is caused to row address strobe signal /RAS, the noise affects word line activation signal RXT after a period during which the signal level of row address strobe signal /RAS changes. Accordingly, if the noise corresponds to a short period of time, an OR operation result of control signal RASF and word line activation signal RXT, i.e., a level of an output signal from logic gate 112 is maintained at the H level without being affected by the noise. Thus, if word line activation signal RXT is used instead of row address decode enable signal RADE, an effect similar to that in the case of the first embodiment can be produced.

Second Modification of First Embodiment

Figure 12:
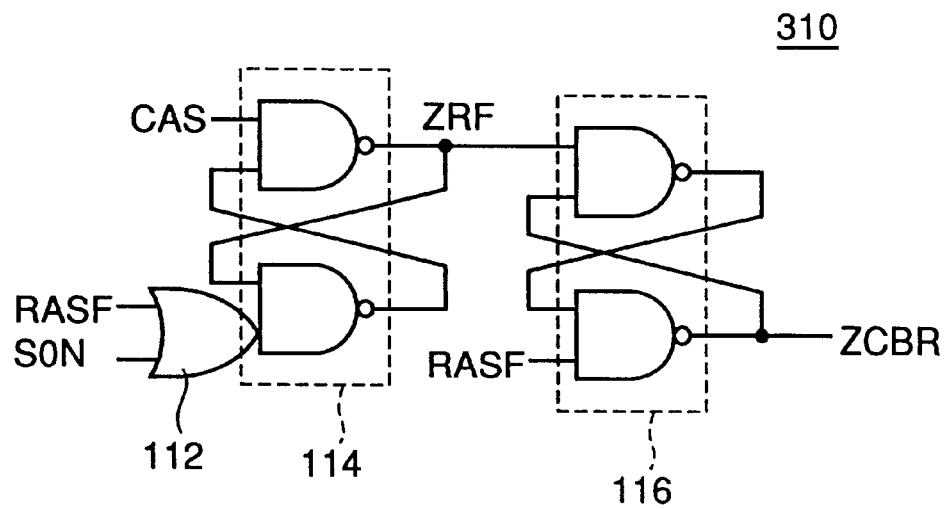
FIG. 12 is a circuit diagram showing an exemplary structure of a refresh control circuit 310 according to the second modification of the first embodiment.

Referring to FIG. 12, refresh control circuit 310 according to the second modification of the first embodiment is different from refresh control circuit 110 shown in FIG. 3 in that one of outputs from logic gate 112 is used as a sense amplifier activation signal S0N instead of row address decode enable signal RADE. The other parts of the structure and operation of the circuit are the same as those of semiconductor memory device 1000 in accordance with the first embodiment and therefore description thereof will not be repeated.

Sense amplifier activation signal S0N is activated/inactivated in responsive to activation/inactivation of row address strobe signal /RAS like word line activation signal RXT, respectively. A signal level of sense amplifier activation signal S0N corresponds to row address strobe signal /RAS delayed by the inverter and delay circuit.

Accordingly, even if the noise is caused to row address strobe signal /RAS, the noise affects sense amplifier activation signal S0N after a period during which the signal level of row address strobe signal /RAS changes. Accordingly, if the noise corresponds to a short period of time, a level of an output signal from logic gate 112 is maintained at the H level without being affected by the noise. Thus, sense amplifier activation signal S0N can be used instead of row address decode enable signal RADE to produce an effect similar to that in the first embodiment.

Third Modification of the First Embodiment

Figure 13:
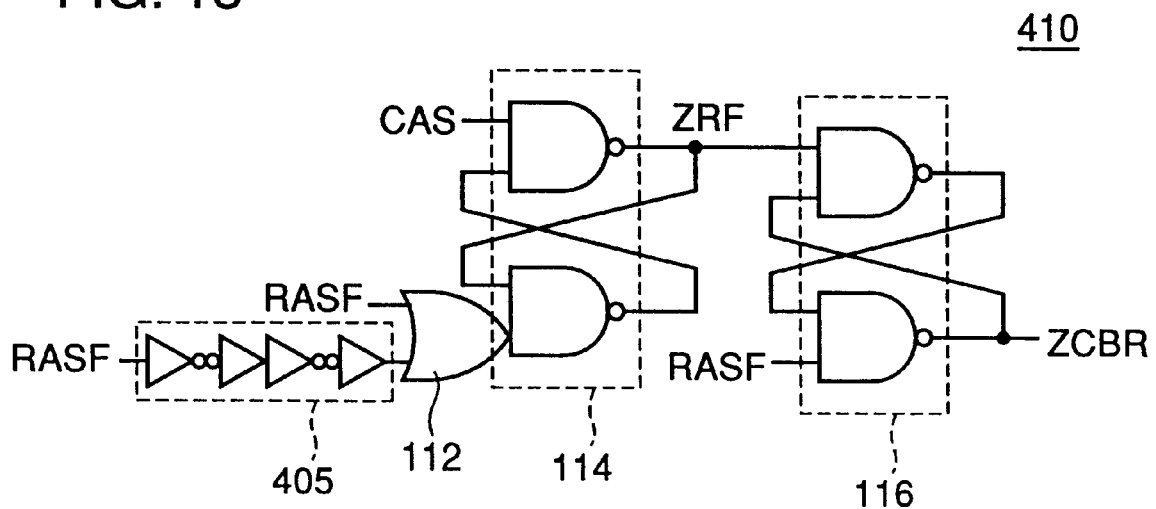
FIG. 13 is a circuit diagram showing an exemplary structure of a refresh control circuit 410 according to the third modification of the first embodiment.
Figure 14:
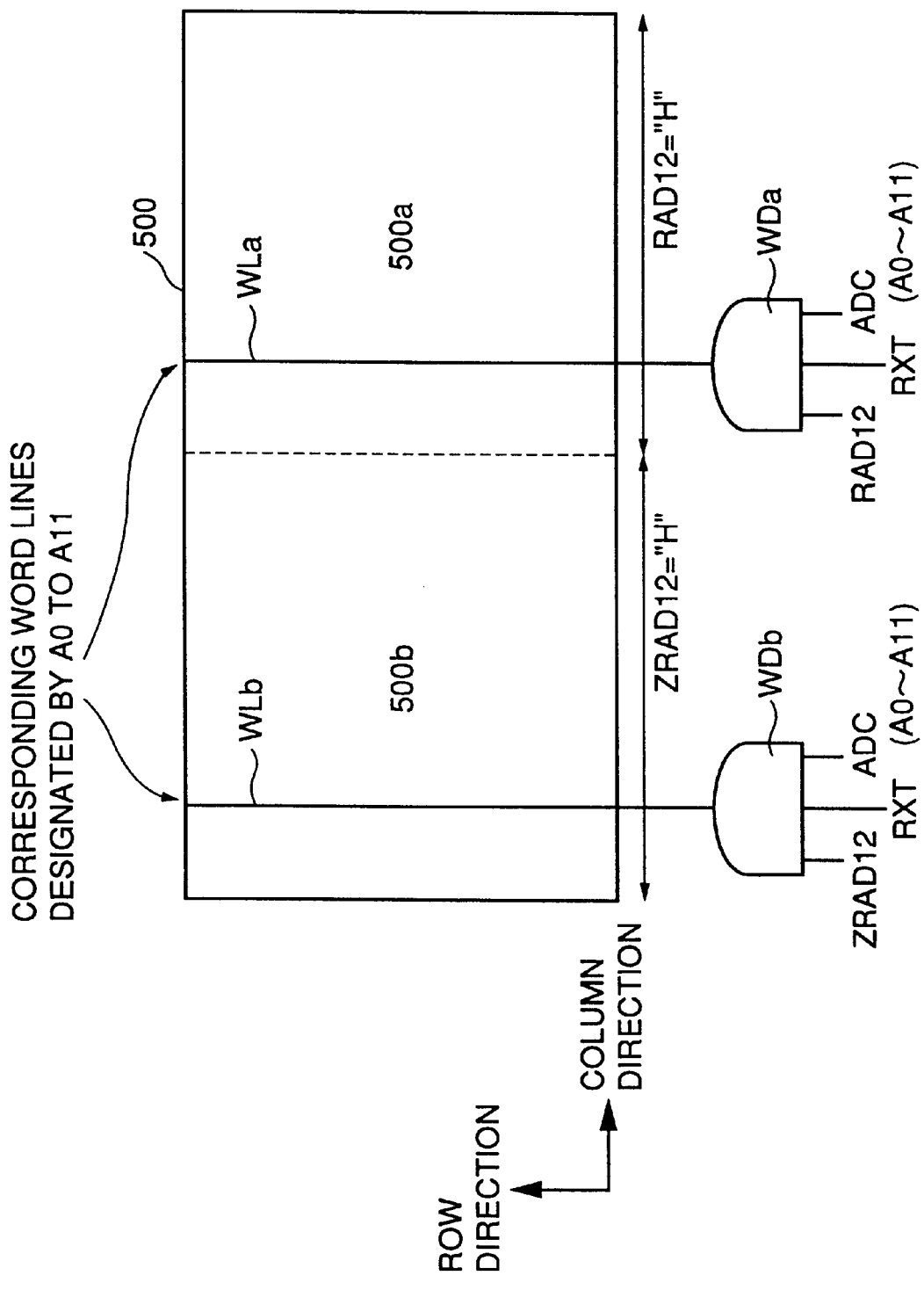
FIG. 14 is a schematic diagram showing a memory array 500 of a DRAM structured to select the greater number of word lines during a refresh operation than during a normal operation.

Referring to FIG. 13, refresh circuit 410 according to the third modification of the first embodiment is different from refresh circuit 110 shown in FIG. 3 in that one of outputs from logic gate 112 is used as a delay signal of control signal RASF, which is an output from delay circuit 405, instead of row address decode enable signal RADE. The other parts of the structure and operation of the circuit are the same as those of semiconductor memory device 1000 of the first embodiment and therefore description thereof will not be repeated.

In the above described structure, if noise is instantly caused to control signal RAS due to the noise caused to row address strobe signal /RAS, an output from logic gate 112 is maintained at the H level. As a result, refresh control signal ZCBR does not change to the L level.

Therefore, a delay signal of control signal RASF can be used in place of row address decode enable signal RADE to produce an effect similar to that in the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device starting a refresh operation in accordance with an order of activation of first and second control signals, comprising:

a control circuit generating an internal control signal activated/inactivated in accordance with activation/inactivation of said second control signal, respectively, and designating start of said refresh operation in accordance with activation of said first control signal when both of said second control signal and said internal control signal are in an inactive state;

a memory cell array having a plurality of memory cells arranged in a matrix, said memory cell array being divided into a plurality of row blocks in a row direction of said memory cells, each of said plurality of row blocks including a plurality of word lines arranged correspondingly to a plurality of memory cell rows; and a row selection circuit selecting one of said memory cell rows in each of said plurality of row blocks in accordance with an address signal, said row selection circuit being controlled by said control circuit for activating one of said plurality of word lines corresponding to the selected memory cell row in at least one of said plurality of row blocks during a normal reading/writing operation and activating one of said plurality of word lines corresponding to the selected memory cell row in each of a greater number of said row blocks during said refresh operation than during said normal reading/writing operation.

2. The semiconductor memory device according to claim 1, wherein said control circuit includes a first sub control circuit generating a refresh control signal activated during said refresh operation, said first sub control circuit activates a refresh enable signal upon activation of said first control signal when both of said second control signal and said internal control signal are in an inactive state, and activates said refresh control signal upon activation of said second control signal when said refresh enable signal is in an active state, and said first sub control circuit inactivates said refresh enable signal upon inactivation of said first control signal when one of said second control signal and said internal control signal is in said active state, and inactivates said refresh control signal upon inactivation of said second control signal when said refresh enable signal is in said inactive state.

3. The semiconductor memory device according to claim 2, wherein said second control signal is a row address strobe signal for designating activation of a row related operation, said control circuit further includes a second sub control circuit sequentially activating a row address decode enable signal, word line activation signal and sense amplifier activation signal when a prescribed period of time is elapsed in accordance with activation of said row address strobe signal, said second sub control circuit sequentially inactivates said word line activation signal and said sense amplifier activation signal when a prescribed period of time is elapsed in accordance with inactivation of said row address strobe signal, and inactivates said row address decode enable signal in accordance with inactivation of both of said sense amplifier activation signal and said row address strobe signal, and said first sub control circuit generates said refresh control signal using said row address decode enable signal as said internal control signal.

4. The semiconductor memory device according to claim 2, wherein said second control signal is a row address strobe signal designating activation of a row related operation, said control circuit further includes a second sub control circuit sequentially activating a row address decode enable signal, word line activation signal and sense amplifier activation signal when a prescribed period of time is elapsed in accordance with activation of said row address strobe signal, said second sub control circuit sequentially inactivates said word line activation signal and said sense amplifier activation signal when a prescribed period of time is elapsed in accordance with inactivation of said row address strobe signal, and inactivates said row address decode enable signal in accordance with inactivation of both of said sense amplifier activation signal and said row address strobe signal, and said first sub control circuit generates said refresh control signal using said word line activation signal as said internal control signal.

5. The semiconductor memory device according to claim 2, wherein said second control signal is a row address strobe signal for designating activation of a row related operation, said control circuit further includes a second sub control circuit sequentially activating a row address decode enable signal, word line activation signal and sense amplifier activation signal when a prescribed period of time is elapsed in accordance with activation of said row address strobe signal, said second sub control circuit sequentially inactivates said word line activation signal and said sense amplifier activation signal when a prescribed period of time is elapsed in accordance with inactivation of said row address strobe signal, and inactivates said row address decode enable signal in accordance with inactivation of both of said sense amplifier activation signal and said row address strobe signal, and the first sub control circuit generates said refresh control signal using said sense amplifier activation signal as said internal control signal.

6. The semiconductor memory device according to claim 2, wherein said second control signal is a row address strobe signal for designating activation of a row related operation, and said first sub control circuit has a delay circuit delaying said row address strobe signal by a prescribed delay time for outputting said internal control signal.

* * * * *